(12) United States Patent
Toonen et al.

(10) Patent No.: US 10,043,964 B2
(45) Date of Patent: Aug. 7, 2018

(54) PYROELECTRIC DEVICE

(71) Applicant: U.S. Army Research Laboratory ATTN: RDRL-LOC-I, Adelphi, MD (US)

(72) Inventors: Ryan C. Toonen, Belcamp, MD (US); Mathew P. Ivill, Havre de Grace, MD (US); Melanie W. Cole, Churchville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 15/606,091

(22) Filed: May 26, 2017

(65) Prior Publication Data

US 2017/0263841 A1    Sep. 14, 2017

Related U.S. Application Data

(63) Continuation-in-part of application No. 14/490,777, filed on Sep. 19, 2014, now Pat. No. 9,666,729.

(51) Int. Cl.
| | |
|---|---|
| *H01L 37/02* | (2006.01) |
| *H01L 27/16* | (2006.01) |
| *B82Y 10/00* | (2011.01) |
| *H01L 29/66* | (2006.01) |
| *H01L 29/93* | (2006.01) |
| *H01L 29/06* | (2006.01) |

(52) U.S. Cl.
CPC ............ *H01L 37/025* (2013.01); *B82Y 10/00* (2013.01); *H01L 27/16* (2013.01); *H01L 29/0653* (2013.01); *H01L 29/0676* (2013.01); *H01L 29/66174* (2013.01); *H01L 29/93* (2013.01); *H01L 37/02* (2013.01)

(58) Field of Classification Search
CPC ....... H01L 37/025; H01L 28/20; H01L 28/40; H01L 28/60; H01L 37/00; H01L 37/02; H01L 27/16; H01L 27/0658; H01L 27/0288; H01L 27/11; H01L 27/10852; H01L 27/10844; H01L 27/0629; H01L 29/66; H01L 29/93; H01L 29/0653; H01L 29/0676
USPC ....................................................... 257/467
See application file for complete search history.

(56) References Cited

U.S. PATENT DOCUMENTS

| | | | |
|---|---|---|---|
| 9,666,729 B2 | 5/2017 | Toonen et al. | |
| 2004/0046123 A1* | 3/2004 | Dausch | B81B 3/0035 250/351 |
| 2009/0025215 A1 | 1/2009 | Murakami | |
| 2015/0048292 A1 | 2/2015 | Park | |

\* cited by examiner

*Primary Examiner* — Chuong A Luu
(74) *Attorney, Agent, or Firm* — Christos S Kyriakou

(57) ABSTRACT

A pyroelectric device having a substrate and a first electrode overlying at least a portion of the substrate. A plurality of spaced apart nanometer sized pyroelectric elements are electrically connected to and extending outwardly from the first electrode so that each element forms a single domain. A dielectric material is deposited in the space between the individual elements and a second electrode spaced apart from said first electrode is electrically connected to said pyroelectric elements.

14 Claims, 3 Drawing Sheets

PYROELECTRIC DEVICE

CROSS-REFERENCE TO RELATED APPLICATIONS

This application is a continuation-in-part of U.S. patent application Ser. No. 14/490,777 filed on Sep. 19, 2014 now U.S. Pat. No. 9,666,729 by inventors Ryan C. Toonen, Mathew P. Ivill and Melanie Will-Cole titled "Nano-Structured Paraelectric or Supra Electric Varactors for Agile Electronic Systems" which is hereby incorporated herein by reference in its entirety including all attachments, appendices and figures filed with U.S. Non-Provisional patent application Ser. No. 14/907,777.

GOVERNMENT INTEREST

The invention described herein may be manufactured, used, and licensed by or for the United States Government.

BACKGROUND OF THE INVENTION

I. Field of the Invention

The present invention relates generally to pyroelectric devices.

II. Description of Related Art

Pyroelectricity, or the pyroelectric effect, is a physical property of polar dielectric materials which undergo a spontaneous change in polarization of the material in response to a change in temperature. The spontaneous polarization is defined as the polarization in a pyroelectric material that spontaneously forms in the absence of an applied electric field. Pyroelectric materials are used in a variety of sensing and detecting applications. Notably, they have found widespread use as electromagnetic energy detectors and bolometers at various wavelengths, including infra-red (IR) detectors and imagers for motion sensing and night-vision applications. In the radio frequency (RF) and microwave bands, they are used for instrumentation-grade power level sensors and radio astronomy radiometers, and can also be used for the detection of millimeter-wave and THz frequencies.

The amount of change of polarization in response to a change in temperature $$\left(\frac{\partial P}{\partial T}\right)$$

is often quantified as a vector p, known as the pyroelectric coefficient. Physically, the internal structure of the electric dipoles of the pyroelectric material becomes modified during a temperature change. This modification can include a reorientation of molecular dipoles in the case of polymeric materials or a displacement in the atomic arrangement of charged atoms in the case of ferroelectric crystals. These displacements in turn cause a change in the spontaneous polarization and subsequent change in the surface charge of the material.

A typical pyroelectric capacitor is formed by adding a top and a bottom electrode to a pyroelectric material. The pyroelectric capacitor is then connected to an external circuit so that a variation in the surface charge on the capacitor will generate a flow of current as that charge is redistributed between the top and bottom faces of the capacitor in response to temperature changes. This current is given by the formula $i_p = Ap(dT/dt)$ where A is the area of the capacitor, p is the pyroelectric coefficient, and $(dT/dt)$ is the time rate of change of temperature.

In a pyroelectric material, the internal dipoles which form the polarization are typically broken up into small regions of homogenous polarization known as domains. In polar crystals, the orientation of these domains is restricted by the structure of the material since the atomic arrangements, and their displacements, responsible for the polarization are restricted by the bonding symmetry of the crystal. For example, in the case of barium titanate ($BaTiO_3$), a ferroelectric oxide with a perovskite crystal structure, the polarization occurs from a shift in the location of the central Ti atom with respect to the oxygen octahedral cage (consisting of 6 oxygen atoms) surrounding the Ti atom. The atomic displacement of the Ti atom is restricted to orthogonal crystallographic directions (displacements towards one of the 6 surrounding oxygens). Subsequently, the polarization orientations are limited to these orthogonal directions.

In polycrystalline materials with random grain orientation only a component of each domain will be able to contribute to the overall measured polarization. Only those domains that are oriented normal to the capacitor face will be able to contribute their full component of polarization to the pyroelectric device. The pyroelectric properties are thus compromised and diminished by misaligned domains in these materials.

Additionally, stress and strain are critical factors in the physical properties of pyroelectric materials. In a typical pyroelectric thin film, the film is rigidly clamped to the supporting substrate. Strains in the film are then created from lattice and thermal mismatches with the substrate. For films on non-lattice matched substrates, thermal strain from differences in thermal expansion coefficients is the most prominent source of strain. Most of the useful pyroelectric materials, including Lead Zirconium Titanate (PZT) and Barium Strontium Titanate (BST) and their derivatives, will develop in-plane (biaxial) tension on the commonly used substrates in the microelectronics industry, including silicon and sapphire. In-plane tensile strains are known to diminish the out-of-plane pyroelectric coefficient of these materials. Therefore, typical thin-film pyroelectric devices will show reduced performance when integrated into common complimentary metal-oxide semiconductor (CMOS) processing. This is a limiting factor when attempting to integrate pyroelectric devices directly into semiconductor fabrication, such as manufacturing pyroelectric arrays directly on silicon-based read-out circuitry.

BRIEF DESCRIPTION OF THE INVENTION

The present invention provides a pyroelectric device which overcomes the above mentioned disadvantages of the previously known pyroelectric devices.

In brief, the pyroelectric device of the present invention comprises a substrate made of any conventional substrate material, such as silicon. A first electrode comprising a conductive material overlies at least a portion of the substrate.

A plurality of spaced apart nanometer sized pyroelectric elements are then electrically connected to and extend outwardly from the first electrode. These pyroelectric elements are separated from each other by a dielectric material, such as a vacuum, polymeric material, or so forth, so that the pyroelectric elements form single domain and non-interacting nano-pyroelectric elements. A second electrode is then deposited over the other ends of the pyroelectric elements so that the second electrode is spaced apart and generally parallel to the first electrode. Optionally, an absorbing layer overlies a portion of the second electrode.

The state of each element will be in the form of a single ferroelectric/pyroelectric domain. Since the size of each element is approximately equal to or smaller than the equilibrium ferroelectric domain size, each element will exist as a single polarize-able domain. The orientation of each domain can be controlled by the crystallographic axis of the material. For maximum domain polarization, leading to maximum pyroelectric response, the domain polarization can be engineered normal to the electrodes.

Since the pyroelectric elements are nanosized and separated and, thus, electrically insulated from each other in a plane through the dielectric, the pyroelectric elements form an array of single domain and non-interacting elements. Furthermore, the ferroelectric domain, and therefore the polarization vector, of each element is oriented perpendicular relative to the electrodes, thus increasing the overall efficiency and sensitivity of the pyroelectric device. Since each element is single domained and isolated by the dielectric matrix, there is no domain wall movement between elements.

The magnitude of the pyroelectric current generated due to a temperature change is proportional to the area of the pyroelectric elements. Since the pyroelectric elements are preferably nanometer sized, only a small current will be generated by each pyroelectric element in response to a temperature change. However, a macroscopic pyroelectric effect can be produced by the many nanometer sized pyroelectric elements acting in unison under the electrode region. Thus, a large net pyroelectric response can be produced that will exhibit higher sensitivity and higher fidelity than the previously known pyroelectric devices.

In order to enhance the pyroelectric response of the device, the dielectric matrix material can be chosen to modify and tune the strain in the pyroelectric elements. For example, in the preferred embodiment, the dielectric may have a thermal expansion coefficient (TCE) that is less than the substrate material. Therefore, even for pyroelectric elements that may have TCE larger than the substrate, producing deleterious tensile strain in the pyroelectric element, the dielectric can be used to tune the strain state of the pyroelectric elements by providing compressive strain around the pyroelectric elements. Other embodiments are possible, such as using a pressurized dielectric gas between elements. We describe the preferred embodiment, for purposes of illustration, the specific case of $Ba_{0.6}Sr_{0.4}O_3$ (BST 60/40) nanorods on a sapphire substrate. Details of the numerical simulations are provided in the Example section. Processing BST film on sapphire produces a tensile strain in the BST that significantly diminishes and even eliminates the pyroelectric properties when deposited or annealed at temperatures needed to crystallize the BST film. By using BST nanorods and a $SiO_2$ dielectric matrix (TCE $SiO_2$<TCE Sapphire<TCE BST) in the present device, the pyroelectric properties (and the overall materials figure of merit) can be returned and even enhanced.

BRIEF DESCRIPTION OF THE DRAWING

A better understanding of the present invention will be had upon reference to the following detailed description of the invention when read in conjunction with the drawing, wherein like reference characters refer to like parts throughout the several views, and in which.

DETAILED DESCRIPTION OF A PREFERRED EMBODIMENT OF THE INVENTION

Figure 1:
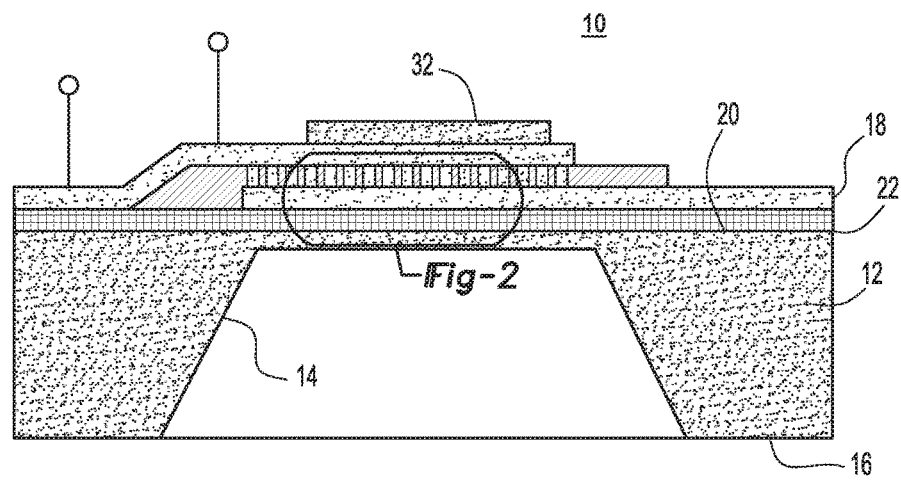
FIG. 1 is a cross-sectional view illustrating a preferred embodiment of the pyroelectric device of the present invention.

With reference first to FIG. 1, a preferred embodiment of a pyroelectric device 10 according to the present invention is shown. The pyroelectric device includes a substrate 12 which may be made of any conventional material, such as silicon. The substrate 12 optionally includes a cutout or thinned portion 14, including, but not limited to, dimples, backside trenched and/or etched areas formed on a bottom surface 16 of the substrate 12. These optional but desirable cutouts 14 help thermally insulate the pyroelectric elements from the substrate in order to minimize the effect of any thermal absorption by the substrate 12 thus increasing the sensitivity of the pyroelectric device 10.

A conductive electrode 18 is deposited over at least a portion of an upper surface 20 of the substrate 12. Any conventional deposition method may be used to apply the electrode 18 to the substrate 12. Optionally, however, an adhesion layer 22 is optionally provided between the electrode 18 and upper surface 20 of the substrate 12 to improve the adhesion between the electrode 18 and substrate 12. The electrode 18 may be made of any conductive material, such as metals or conductive ceramics.

Figure 2:
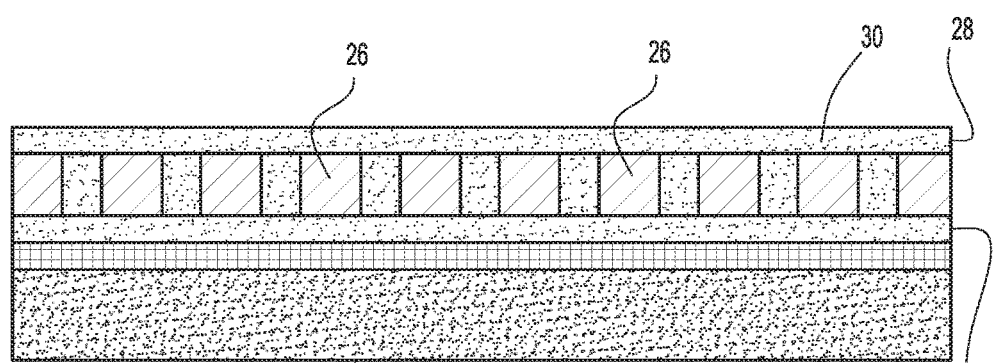
FIG. 2 is a sectional view taken along circle 2-2 in FIG. 1 and enlarged for clarity.

With reference now to FIGS. 1 and 2, a pyroelectric material is then deposited on the electrode 18 by any conventional means, including but not limited to thin film deposition processes, RF sputtering, spin coating metal-organic precursor, or other known film deposition methods including, but not limited to atomic deposition methods and pulsed laser deposition methods. As better illustrated in FIGS. 2 and 3, the pyroelectric material is then patterned or self-assembled into nanometer sized regions to form an array 23 of spaced apart nanometer sized pyroelectric elements 24. Nanometer sized regions includes regions with a diameter preferably less than or equal to about 15 nm, more preferably less than or equal to about 10 nm, even more preferably less about than 7 nm and still more preferably less than about 5 nm. Any conventional means may be utilized to pattern the layered dielectric material into the array 23 of pyroelectric elements 24, including but not limited to chemical etching, laser etching, ion etching, and so forth. The pyroelectric elements could also be formed by self-assembly or self-segregation, such as the formation of vertically-aligned heterostructures within a matrix, which have been deposited by methods like PLD.

Each of the nano-pyroelectric elements 24 is manufactured to a small size, on the order of a hundred nanometers or smaller, using materials and manufacturing processes that could entail either "top-down" or "bottom-up" methodology. In certain desirable embodiments each of the nano-pyroelectric elements 24 is manufactured to a small size, on the order of 50 nanometers or smaller. In other desirable embodiments each of the nano-pyroelectric elements 24 is manufactured to a small size, on the order of 35 nanometers or smaller. In yet other desirable embodiments each of the nano-pyroelectric elements 24 is manufactured to a small size, on the order of 15 nanometers or smaller. Top-down processing means that the elements 24 are patterned into the necessary size and geometry by means of mechanical, thermal, optical, or chemical processing such as lithographic and etching techniques. Conversely, bottom-up processing describes elements forming into the necessary size and geometry by means of mechanical, thermal, optical, or chemical processing in the form of nano-templating or self-assembly or similar processes. Elements may also be formed within the surrounding matrix by selective crystallization, such as localized laser heating, microwave sintering, or similar process.

A dielectric medium 26 is then deposited or otherwise formed over the array 23 of pyroelectric elements 24 so that the dielectric material 26 substantially fills the space in between the pyroelectric elements 24. In doing so, each pyroelectric element 24 is insulated from its adjacent pyroelectric elements 24. Desirably, each pyroelectric element is insulated from adjacent pyroelectric elements such that individual pyroelectric element do not interact physically or electrically with one another and, thus, reduce or eliminate the formation of domain walls allowing each pyroelectric element to behave as an independent domain. The dielectric and pyroelectric may be deposited simultaneously, and the pyroelectric elements formed by self-segregation into individual elements within the dielectric matrix.

After both the pyroelectric material is deposited and patterned onto the electrode 18, and the dielectric material 26 deposited in the spaces between the pyroelectric elements 24, the upper or free surface of the pyroelectric elements 24 and dielectric material 26 is planarized or flattened. Thereafter, a conductive electrode 28 is deposited on at least a portion of the flattened surface 30 of the dielectric material 26 and pyroelectric elements 24.

Although it is preferred that the dielectric material 26 is deposited into the spaces between the pyroelectric elements 24, optionally, the dielectric material 26 may comprise a vacuum, free space, a gas or mixture of gases, including but not limited to, inert gases and air.

After the second electrode 28 is deposited over the array 23 of pyroelectric elements 24 so that the electrodes 28 and 18 are spaced apart and generally parallel to each other, an absorbing layer 32 is optionally deposited over a portion of the electrode 28. This absorbing layer 32 absorbs impinging photons or other physical or chemical interaction for improved performance of the pyroelectric device. Optionally, the absorbing layer 32 may be designed to absorb wavelengths of electromagnetic energy or other physical process and to convert them for heat for the pyroelectric response. This response generates a current between the electrodes 18 and 28 which increases as a function of the rate of temperature change of the pyroelectric device 10.

Figure 4:
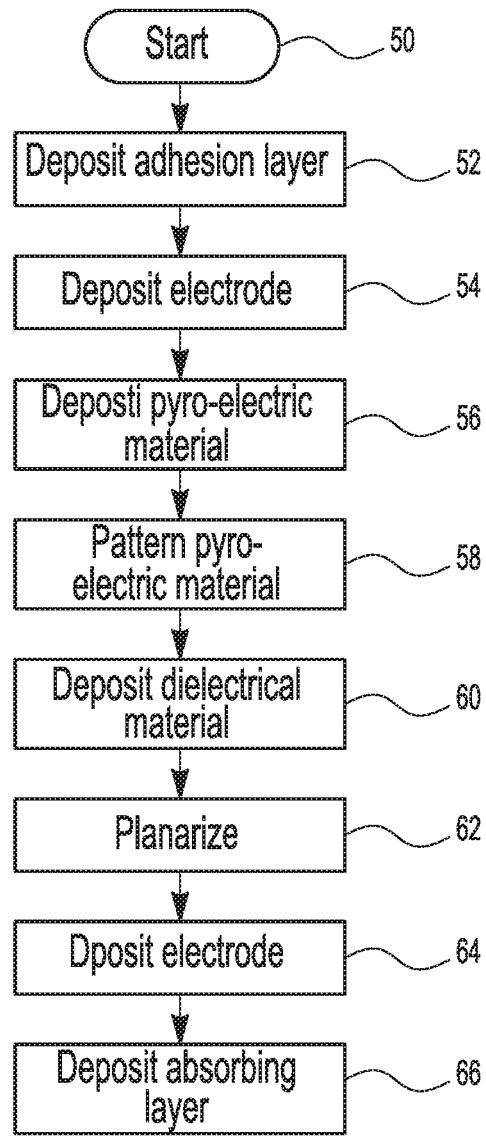
FIG. 4 is a flowchart illustrating the method of manufacturing the pyroelectric device of the present invention.

With reference now to FIG. 4, a flowchart illustrating the method of manufacturing of a pyroelectric device is shown. After starting the process at step 50, step 50 proceeds to step 52 where optionally the adhesion layer 22 is deposited on at least a portion of one surface of the substrate 12. Step 52 then proceeds to step 54.

At step 54, a conductive film is deposited on at least a portion of the adhesion layer 22, if present, or directly across an upper surface 20 of the substrate 12 if not. This conductive film forms the first electrode 18. Step 54 then proceeds to step 56.

At step 56, the pyroelectric material is deposited over at least a portion of the electrode 18. Step 56 then proceeds to step 58.

Figure 3:
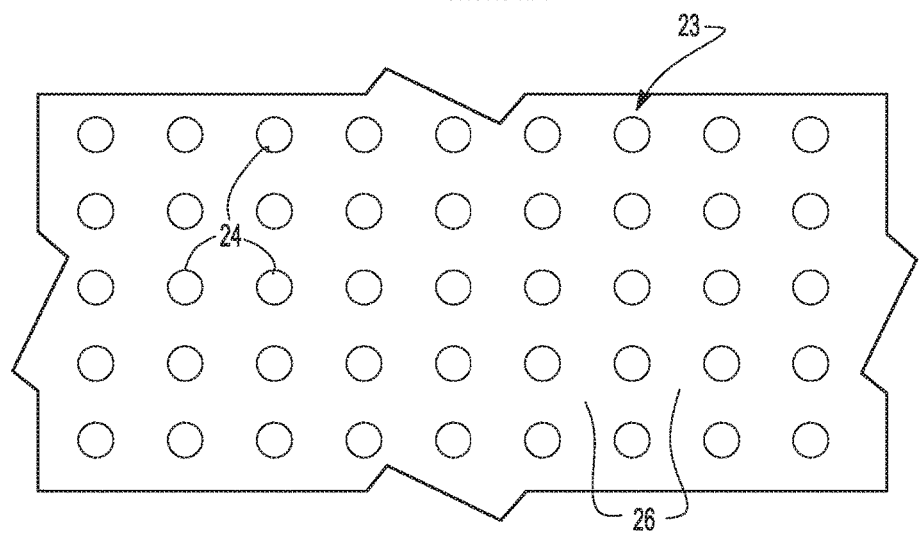
FIG. 3 is a fragmentary top plan view illustrating the pyroelectric array of the present invention and enlarged for clarity.

At step 58, the pyroelectric material is patterned into the array 23 of nanometer sized pyroelectric elements 24. Although the pyroelectric elements 24 are illustrated in FIG. 3 as being generally cylindrical in shape, they may be of any shape without deviation from the spirit or scope of the invention. Step 58 then proceeds to step 60.

At step 60, dielectric material 26 is deposited or otherwise formed into the space between the pyroelectric elements 24 thus isolating the pyroelectric elements from each other. Any conventional means may be used to deposit the dielectric material at step 60 and, optionally, the dielectric material may comprise a vacuum. Step 60 then proceeds to step 62.

At step 62 the free or open side of the array 23 and dielectric material 26 is planarized or flattened to form an appropriate surface for the subsequent deposition of the second electrode 28 at step 64. Step 64 then proceeds to step 66.

At step 66, the absorbing layer 32 is optionally deposited over at least a portion of the electrode 28 thus completing the formation of the pyroelectric device. Any conventional means, such as wire bonding or conductive bus (or address) lines, is used to connect the electrodes 18 and 28 to appropriate terminals for use in circuitry.

The pyroelectric device of the present invention achieves many advantages over the previously known single domain pyroelectric devices. In particular, since each pyroelectric element 24 exists as a single polarizable domain, it is isolated from the effects of its adjacent pyroelectric elements 24 by the dielectric material 26. Furthermore, each nanometer sized pyroelectric element 24 is aligned uniformly and normal to the electrode faces 28 and 18. Such a normal alignment of the pyroelectric elements 24 achieves maximum pyroelectric sensitivity for maximum performance.

Furthermore, each nanometer sized pyroelectric element is isolated from its adjacent pyroelectric elements by the non-interacting dielectric material 26. This thus enables each pyroelectric element 26 to behave independently of its adjacent elements 26 so that each exists as an individual domain. However, since the pyroelectric elements 24 are connected in parallel to each other, they behave in concert to produce a macroscopic pyroelectric effect.

The overall capacitance as well as the dielectric loss of the pyroelectric device 10 may be selectively tuned. Such tuning can be accomplished, for example, by varying the size of the electrode 18 or 28, varying the dielectric constant of the dielectric material 26, the spacing between the electrodes 18 and 28, etc. The overall capacitance of the device also plays a significant role in determining the properties of the external circuit that the arrays 23 are connected to as well as the performance figure-of-merit for the pyroelectric elements.

A primary advantage of the pyroelectric device of the present invention is that by using the array 23 of pyroelectric elements 24, a more regular and reproducible hysteresis curve may be achieved. This occurs since there is only one domain per element 24. Any effects from domain wall nucleation and movement are essentially nonexistent with the array 23 of pyroelectric elements.

The present invention also achieves less ferroelectric fatigue since there is only one domain per element. Since only a single domain is active in contributing to the pyroelectric effect for each element 24, there is less amplitude loss over time and repetitive thermocycles and thus less fatigue of the overall pyroelectric device 10.

The pyroelectric array 23 also has potential for greater temperature stability and reproducibility. Since there is only one domain per element 24, the pyroelectric element is less susceptible to thermal hysteresis which might otherwise be caused by multiple domain states. Effects from domain wall nucleation and movement are essentially non-existent.

The nano-pyroelectric array 23 will also exhibit greater temperature sensitivity, temperature resolution, engineering figure-of-merit, higher signal-to-noise ratio, and efficiency than the previously known ferroelectric devices.

Example

Certain preferred embodiments of the present invention have advantages over traditional thin-film pyroelectric materials. One preferred embodiment consists of pyroelectric nano-elements made from barium strontium titanate (BST), with composition $Ba_{0.6}Sr_{0.4}TiO_3$, and a dielectric matrix of $SiO_2$ fabricated on a sapphire substrate. Other examples of BST compositions and their derivatives include, but are not limited to, the BST compositions and/or structures described in U.S. Pat. Nos. 9,506,153, 8,216,701, 6,803,134 and 6,803,071 which are hereby incorporated by reference herein. Numerical simulations of the pyroelectric coefficient and detection figure of merit (FoM) are calculated using the phenomenological Landau-Devonshire theory and thermal strain in the film. Although we illustrate results for BST, the concept should be general to other ferroelectrics as well.

The most prominent source of strain for films on non-lattice matched substrates is the thermal strain created by the mismatch in thermal expansion coefficients (CTE) of the film and substrate. The amount of in-plane thermal strain is given by:

$$\mu_T(Tg) = \int_{Rt}^{Tg} \alpha_f(T)dT - \int_{Rt}^{Tg} \alpha_s(T)dT$$

where $\alpha_f(T)$ and $\alpha_s(T)$ represent the temperature-dependent thermal expansion coefficients of the film and substrate, respectively. The symbol Tg is used to represent the growth (or annealing) temperature and the lower bound of integration is taken to be room temperature, Rt=25° C. The above expression applies for an isotropic homogeneous thin-film. In order to account for the differences in thermal expansion of the ferroelectric nanorods and dielectric matrix, we use a modified (composite) thermal expansion coefficient by applying the rule-of-mixtures:

$$\alpha_c(\theta) = \alpha_F\theta + \alpha_D(1-\theta)$$

where $\alpha_F$ and $\alpha_D$ are the thermal expansion coefficients of the ferroelectric and dielectric, respectively, and $\theta$ is the volume fraction of ferroelectric. The dielectric matrix can be used to tune the strain (tensile, compressive, or zero strain) in the resulting film by selection of the thermal expansion property. Thermal expansion coefficients are given in Table 1 below:

TABLE 1

| Thermal Expansion Coefficients | | |
|---|---|---|
| Material | TEC × $10^6$ (° C.$^{-1}$) | Reference |
| Sapphire a-axis | $7.419 + 6.4130^{-4} \times T - 3.211\exp(-2.59 \times 10^{-3} \times T)$ | [1] |
| BST 60/40 | $8.90 + 7.90 \times 10^{-3} \times T$ | [1] |
| $SiO_2$ | 0.5 | |

The dielectric properties (relative permittivity and pyroelectric coefficient) of the BST can be modeled using the Landau-Devonshire form of the free energy similar to reference 1 [Zhang et al., "Pyroelectric properties of barium strontium titanate films: Effect of thermal stresses", *J. Appl. Phys.*, 108, 054103 (2010) and referenced herein] The Landau-Devonshire energy of BST textured in a [001] direction is given by:

$$G(P, T, \mu, E) = \tilde{\delta}_1 P^2 + \tilde{\delta}_{11} P^4 + \delta_{111} P^6 + \frac{\mu^2}{S_{11} + S_{12}} - EP$$

where P is the polarization and E is an applied field along the direction normal to the film. The symbols $\tilde{\delta}_1$ and $\tilde{\delta}_{11}$ are renormalized dielectric stiffness coefficients given by the following:

$$\tilde{\delta}_1 = \delta_1 - \mu \frac{2Q_{12}}{S_{11} + S_{12}}$$

$$\tilde{\delta}_{11} = \delta_{11} + \frac{Q_{12}^2}{S_{11} + S_{12}}$$

where $\delta_1$, $\delta_{11}$, and $\delta_{111}$ are the dielectric stiffness coefficients of the Landau-Devonshire potential. $Q_{12}$ is an electrostrictive coefficient and $S_{11}$ and $S_{12}$ are the elastic compliances of the film. The generalized strain, $\mu$, in the free energy is replaced by the thermal strain, $\mu_T$, given above. The equilibrium (spontaneous) polarization is found by minimizing the free energy by setting the first partial derivative to zero, $$\frac{\partial G}{\partial P} = 0.$$

The dielectric response (normal to the film) of the BST can be derived as:

$$\varepsilon_F = \left(\frac{\partial^2 G}{\partial P^2}\right)^{-1}$$

and evaluated at the spontaneous polarization, Ps. The pyroelectric coefficient (also normal to the film) is given by:

$$p_F = \frac{\partial P_s}{\partial T} + \int_0^E \left(\frac{\partial \varepsilon_F}{\partial T}\right)_E dE$$

The first term is related to the direct pyroelectric coefficient given by the change in spontaneous polarization due to a change in temperature; essentially a change in the dipole structure caused by a thermal fluctuation. The second term is related to the portion of the pyroelectric coefficient that is induced by an applied electric field. Any dielectric can show an induced pyroelectric response if sufficiently biased by an external field. This is typically referred to as a dielectric-bolometer or a dielectric in bolometer-mode. Only those materials, such as ferroelectrics, which retain a spontaneous polarization in the absence of an external field are capable of a direct pyroelectric response. The external field is set to zero for the present simulations. Input parameters for the BST simulations are listed in Table 2 below:

TABLE 2

Landau and mechanical coefficients, Ref [1]

| Input Parameter | BST 60/40 |
|---|---|
| $T_c$ (° C.) | -29.2 |
| C (° C.) | $1.34 \times 10^5$ |
| $Q_{12}$ (m$^4$/C$^2$) | -0.0324 |
| $C_{11}$ (N/m$^2$) | $2.33 \times 10^{11}$ |
| $C_{12}$ (N/m$^2$) | $9.18 \times 10^{10}$ |
| $\delta_1$ (Nm$^2$/C$^2$) | $(T - T_c)/2\varepsilon_0 C$ |
| $\delta_{11}$ (Nm$^6$/C$^4$) | $2.16 \times 10^6 \times T + 3.02 \times 10^8$ |
| $\delta_{111}$ (Nm$^{10}$/C$^6$) | $3.96 \times 10^9$ |

The pyroelectric device dielectric properties will be a function of both the BST and the surrounding dielectric. This arrangement can be modeled as an array of parallel BST and SiO$_2$ parallel-plate-type capacitors. The total dielectric constant of such an arrangement is given by:

$$\varepsilon_c(\theta) = \varepsilon_F \theta + \varepsilon_D(1-\theta)$$

where $\varepsilon_F$ and $\varepsilon_D$ are the individual dielectric constants of the ferroelectric and dielectric, respectively. We consider a constant value of $\varepsilon_D = 3.9$ for the SiO$_2$. Also, the pyroelectric coefficient of the SiO$_2$ is considered zero ($p_D = 0$).

Figure 5:
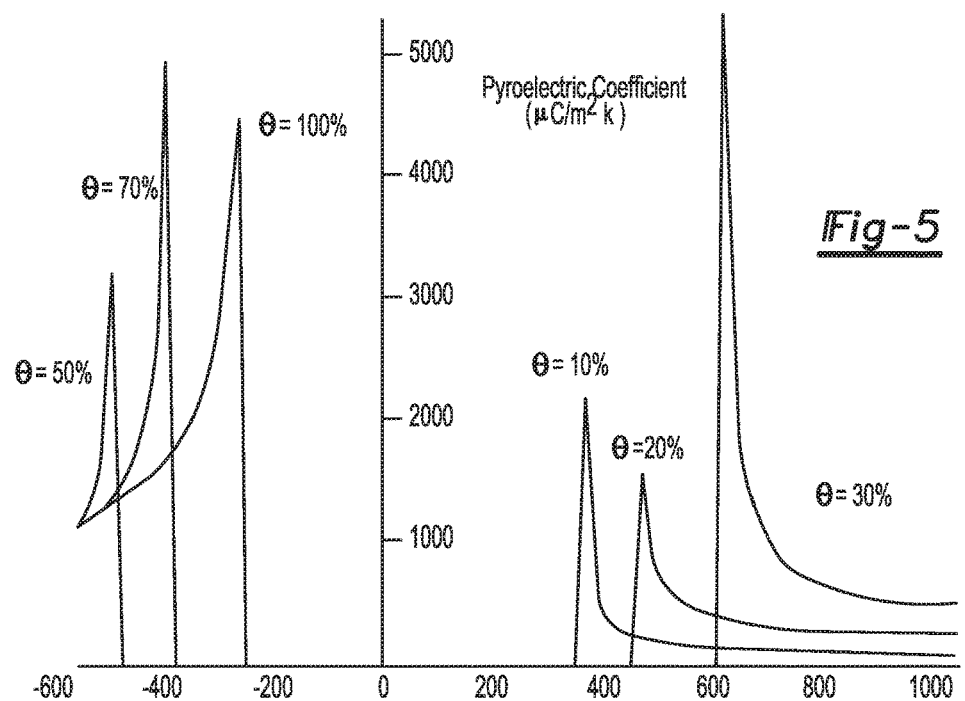
FIG. 5 is a graph of the pyroelectric coefficient.

FIG. 5 shows the calculated room temperature pyroelectric coefficient as a function of growth temperature. The coefficient of the pyroelectric device is calculated by simulating the coefficient of BST under the thermal strain given by various volume fractions of SiO$_2$. The calculated pyroelectric coefficient is then scaled by the volume fraction of BST. The situation is a balance between the amount of BST (the higher areal density, the larger the pyroelectric response that could be produced) and the amount of compressive strain that can be provided by additional SiO$_2$. Mathematically, the dielectric properties diverge and tend towards infinite values near the transition temperatures, but in practice never reach the values suggested by theory. The values slightly before the divergence should be considered more realistic. For large volume fractions of BST, the tensile strain induced from the practical requirements of high-temperature growth have diminished the pyroelectric values from the bulk. A growth temperature lower than approximately -250° C. (not physically realizable and non-practical, but included for illustration) would be needed to induce enough compressive strain in these films to induce pyroelectric properties. However, fairly high values of pyroelectric coefficient can be expected at volume fractions lower than $\theta = 30\%$.

Figure 6:
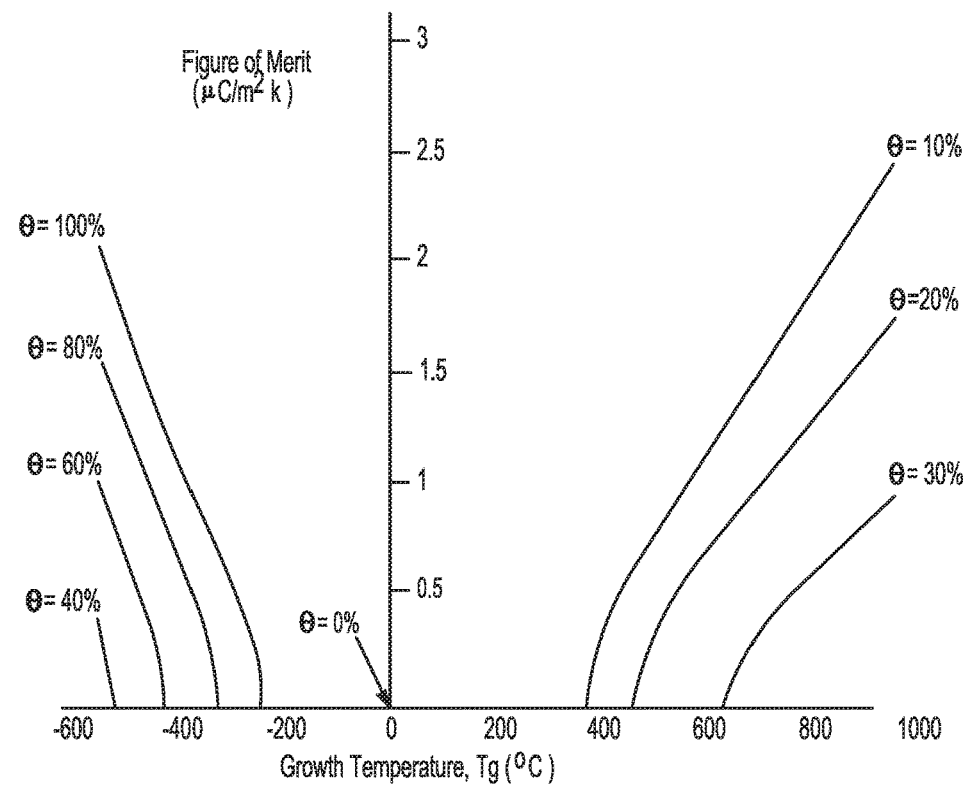
FIG. 6 is a graph of the figure of merit as a function of growth temperature.

It is the FoM that ultimately determines the performance of the material for applications. FIG. 6 shows the resulting detection FoM (p/∈) of the pyroelectric device. Perhaps surprisingly, we see that meta-pyroelectric elements with low values of θ are capable of producing considerable FoM values at practical conditions. Since the dielectric constant of the SiO$_2$ is significantly smaller than that of the BST, the FoM becomes higher for $\theta = 10\%$, even though $\theta = 30\%$ has a higher value of pyroelectric coefficient as seen in FIG. 5.

Patents and publications mentioned in the specification are incorporated herein by reference to the same extent as if each individual document or publication was specifically and individually incorporated herein by reference.

The foregoing description is illustrative of particular embodiments of the invention, but is not meant to be a limitation upon the practice thereof. The following claims, including all equivalents thereof, are intended to define the scope of the invention.

We claim:

1. A pyroelectric device comprising:
a substrate,
a first electrode overlying at least a portion of said substrate,
a plurality of spaced apart nanometer sized pyroelectric elements electrically connected to and extending outwardly from said first electrode, and
a second electrode spaced apart from said first electrode and electrically connected to said pyroelectric elements.

2. The pyroelectric device as defined in claim 1 and comprising a dielectric material disposed between said pyroelectric elements.

3. The pyroelectric device as defined in claim 1 and comprising an adhesion layer between said first electrode and said substrate.

4. The pyroelectric device as defined in claim 1 and comprising a heat absorbing layer overlying at least a portion of said second electrode.

5. The pyroelectric device as defined in claim 1 and comprising a plurality of recesses formed on a side of said substrate opposite from said first electrode.

6. A pyroelectric device comprising:
a substrate,
a first electrode overlying at least a portion of said substrate,
a plurality of spaced apart nanometer sized pyroelectric elements electrically connected to and extending outwardly from said first electrode,
a dielectric material disposed between said pyroelectric elements,
a plurality of recesses formed on a side of said substrate opposite from said first electrode and
a second electrode spaced apart from said first electrode and electrically connected to said pyroelectric elements.

7. The pyroelectric device as defined in claim 6 further comprising a heat absorbing layer overlying at least a portion of said second electrode.

8. The pyroelectric device as defined in claim 6 wherein pyroelectric elements comprise free space, a gas or a mixture of gasses, inert gas or a mixture of inert gasses, air or a combination thereof.

9. The pyroelectric device as defined in claim 6 wherein nanometer sized pyroelectric elements have a diameter of less than 15 nanometers.

10. The pyroelectric device as defined in claim 6 wherein nanometer sized pyroelectric elements have a diameter of less than 10 nanometers.

11. The pyroelectric device as defined in claim 6 wherein nanometer sized pyroelectric elements have a diameter of less than 8 nanometers.

12. The pyroelectric device as defined in claim 1 wherein pyroelectric elements comprise free space, a gas or a mixture of gasses, inert gas or a mixture of inert gasses, air or a combination thereof.

13. The pyroelectric device as defined in claim 1 wherein nanometer sized pyroelectric elements have a diameter of less than 15 nanometers.

14. The pyroelectric device as defined in claim 1 wherein nanometer sized pyroelectric elements have a diameter of less than 10 nanometers.

\* \* \* \* \*